(12) United States Patent
Long

(10) Patent No.: US 10,937,464 B2
(45) Date of Patent: Mar. 2, 2021

(54) SOLID STATE MEMORY CASE WITH ENHANCED COOLING

(71) Applicant: Intel Corporation, Santa Clara, CA (US)

(72) Inventor: Brian J. Long, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/480,665

(22) PCT Filed: Mar. 17, 2017

(86) PCT No.: PCT/US2017/022909
§ 371 (c)(1),
(2) Date: Jul. 24, 2019

(87) PCT Pub. No.: WO2018/169545
PCT Pub. Date: Sep. 20, 2018

(65) Prior Publication Data
US 2020/0174533 A1    Jun. 4, 2020

(51) Int. Cl.
*G11B 33/14* (2006.01)
*H05K 7/20* (2006.01)
*G06F 1/20* (2006.01)
*G06F 1/18* (2006.01)

(52) U.S. Cl.
CPC .......... *G11B 33/142* (2013.01); *G06F 1/187* (2013.01); *G06F 1/20* (2013.01); *H05K 7/20127* (2013.01); *H05K 7/20145* (2013.01); *H05K 7/20163* (2013.01)

(58) Field of Classification Search
CPC .......... H05K 7/20136–20145; H05K 7/20163; G11B 33/14–144; G06F 1/187
See application file for complete search history.

(56) References Cited

U.S. PATENT DOCUMENTS

| | | | | |
|---|---|---|---|---|
| 5,927,386 A | * | 7/1999 | Lin | G11B 33/1426 165/121 |
| 6,637,719 B2 | * | 10/2003 | Jiang | G06F 1/184 248/682 |
| 6,798,656 B1 | * | 9/2004 | Lin | G06F 1/184 248/618 |
| 7,068,506 B2 | * | 6/2006 | Behl | G06F 1/20 174/16.3 |
| 7,388,749 B1 | * | 6/2008 | Feroli | G11B 33/121 361/679.48 |

(Continued)

OTHER PUBLICATIONS

International Preliminary Report on Patentability for International Patent Application No. PCT/US2017/022909 dated Sep. 26, 2019, 10 pgs.

(Continued)

*Primary Examiner* — Zachary Pape
(74) *Attorney, Agent, or Firm* — Schwabe, Williamson & Wyatt, P.C.

(57) ABSTRACT

A case suitable for solid state memory is described that offers enhanced cooling. In one example, a memory case includes a base, a cover having a plurality of fins on a top of the cover, channels between the fins, defined by the fins, and a ramp extending from a front on the top of the cover to the channels, and an inner cavity defined by the base and the cover to house a solid state memory.

20 Claims, 8 Drawing Sheets

(56) References Cited

U.S. PATENT DOCUMENTS

| | | | |
|---|---|---|---|
| 7,643,289 B2* | 1/2010 | Ye | G06F 1/187 361/679.46 |
| 7,778,029 B2* | 8/2010 | Ueno | G11B 33/142 361/695 |
| 8,824,137 B2* | 9/2014 | Nakayama | G11B 33/142 312/223.2 |
| 9,123,686 B2* | 9/2015 | Mataya | H01L 23/373 |
| 9,348,374 B2* | 5/2016 | Liao | G06F 1/187 |
| 9,398,728 B2* | 7/2016 | Tanaka | G06F 12/0868 |
| 9,841,793 B2* | 12/2017 | Kwon | G06F 1/20 |
| 10,076,063 B2* | 9/2018 | Matsuda | G11B 33/124 |
| 2002/0118524 A1 | 8/2002 | Bert, Jr. et al. | |
| 2002/0149911 A1 | 10/2002 | Bishop et al. | |
| 2004/0169956 A1* | 9/2004 | Oba | H05K 7/20418 360/97.15 |
| 2007/0246197 A1 | 10/2007 | Reyzin et al. | |
| 2009/0279246 A1* | 11/2009 | Nguyen | G06F 1/187 361/679.34 |
| 2011/0315355 A1 | 12/2011 | Campbell et al. | |
| 2013/0008626 A1* | 1/2013 | Chao | G11B 33/1426 165/67 |
| 2014/0036435 A1* | 2/2014 | Kim | G06F 1/203 361/679.33 |
| 2015/0331460 A1 | 11/2015 | Mataya et al. | |
| 2016/0054768 A1* | 2/2016 | Kwon | G11B 33/142 361/679.5 |

OTHER PUBLICATIONS

International Search Report and Written Opinion for International Patent Application No. PCT/US2017/022909 dated Dec. 14, 2017, 14 pgs.

* cited by examiner

SOLID STATE MEMORY CASE WITH ENHANCED COOLING

CROSS-REFERENCE TO RELATED APPLICATION

This patent application is a U.S. National Phase Application under 35 U.S.C. § 371 of International Application No. PCT/US2017/022909, filed Mar. 17, 2017, entitled "SOLID STATE MEMORY CASE WITH ENHANCED COOLING," which designates the United States of America, the entire disclosure of which is hereby incorporated by reference in its entirety and for all purposes.

FIELD

The present description pertains to solid state memory and in particular to cooling and housing solid state memory.

BACKGROUND

Mass storage devices for computers have experienced a radical change in cost and size. Not too long ago, the 5.25" hard disk drive was considered a marvel of speed and compactness with capacities of up to tens of GBs. These were replaced with a 3.5" form factor, still offered today with capacities in multiple TBs. The 2.5" Small Form Factor (SFF) hard disk drive was developed as a smaller alternative for notebook computers where low power is more important than speed or capacity. Some notebook computers moved to a 1.8" ultra small form factor hard disk drive but these have almost all been replaced by solid state memory on a card. There are several form factors for the card, such as Mini PCIe (Peripheral Component Interface express), M.2, etc. The deployment of the cards is limited in part by the ubiquity of the hard disk drive form factors and by the cost savings of soldered memory chips directly onto a motherboard or system board.

The old hard disk drive form factors are still in common use. They offer standardization, compatibility with a wide range of different housings, enclosures, cases, and systems and the exterior housing provides protection for the components inside. Standards are already in use for durability and reliability that make it easy to design systems for different applications.

A typical SFF Solid State Drive (SSD) has memory chips and a controller soldered to a motherboard that is attached to an exterior case. The SFF-compliant case can consist of a simple metal or plastic prismatic box with threaded holes on the top, bottom, and sides, for attaching the case to system mounting points. The memory chips are cooled by air passing across the drive housing. High performance drives use aluminum cases to improve heat transfer from the chips to the housing exterior.

The speed, capacity up to multiple TBs, standard form factor, low power, and ubiquity make the SFF SSD a common choice not only for notebook computers but other applications. They are now commonly used in desktop computing, workstations, servers, memory arrays, and large rack mount systems. The SFF case provides ample room for even more memory capacity as solid state memory increased in density and cost decreases.

BRIEF DESCRIPTION OF THE DRAWING FIGURES

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity.

DETAILED DESCRIPTION

As described herein, an SSD case is adapted to direct air flow to favor one side of the case over other sides of the case. Heat transfer fins on the case exterior combine with ramped regions and adjustable air blockers or baffles to direct air past the heat transfer fins. Accordingly, the available system air flows past the most advantageous heat transfer regions of the SSD case. Features, such as fins on the outside of the case and ramps to speed up the air, are added to the case that both enhance heat transfer and favor air flow over certain sides of the case. At the same time, unnecessary air flow to other areas is lessened or eliminated.

Because the 2.5" SFF case was developed for low power hard drives inside notebook computers, it provides very limited cooling to an SSD PCB inside. It follows after the 5.25" and 3.5" form factors which had much more surface area but which were still limited in the amount of heat that could be dissipated to the environment even with existing spin speeds and I/O (Input/Output) demands.

With a solid state memory configuration in the same housing, the Application Specific Integrated Circuits (ASICs), Dynamic Random Access Memory (DRAM) packages, Power Management Integration Circuits (PMICs) and Non-Volatile Memory (NVM) packages in Solid State Drives (SSDs) all generate relatively high temperatures. In a high performance system, such as a server, desktop, workstation, or high capacity memory array, the system temperature can affect the performance of the SSDs and long term reliability. The useful performance, in terms of data transferred per second (e.g., MBtyes/sec), of the SSD can be reduced because of these high system temperatures and because each one of these components also generates its own heat.

By more effectively removing this heat from the SSD components, the memory performance can be maintained or even enhanced in terms of speed and capacity, i.e. total Gigabytes or Terabytes. Longevity and reliability are also improved. A new type of SSD case or enclosure is described herein. While the standard SFF design is simple to fabricate and cheap, its ability to transfer heat from the SSD to the ambient air is limited. While this ability is more than enough for a 4200 rpm spinning two platter disk inside a notebook computer housing, it does not satisfy the needs of solid state components in high performance computing.

Figure 1:
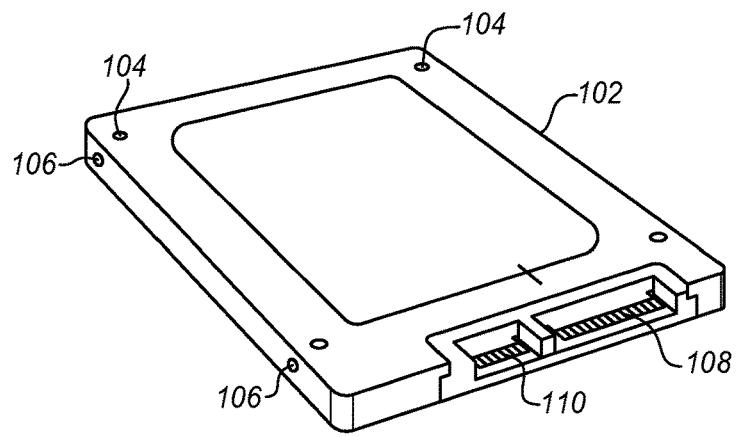
FIG. 1 is an isometric diagram of a 2.5 inch SFF memory case.

FIG. 1 is an isometric diagram of a case that conforms to the 2.5" SSF SSD standards and that can contain a mass memory PCB (Printed Circuit Board). The same form factor is also used for spinning magnetic disk drives. The case 102 has a flattened rectangular shape with a top, a bottom and four sides. Two parallel sides are longer than the other two parallel sides. The case is shown upside down with the bottom exposed. There are four threaded holes 104 that are attachment points in the bottom of the case, one near each corner. There are also four threaded holes on the sides very close to the bottom side holes. One hole is at each end of each of the two long sides. One of the short sides (not shown) is solid and the other of the short sides carries a power connector 108 and a serial data connector 110. In this example, the power and data connectors are of the SATA (Serial Advanced Technology Attachment) type. However, other connectors may be used to suit other applications. The SSF SSD mounts to a tray, carrier, bracket or other housing using the attachment points or by a holder that engages and presses against two or more of the sides of the case.

As shown, the faces of the case 102 are flat and featureless. For a high performance drive, some of the components inside the case use the outer housing as a heat sink and air flows over the top and bottom faces. By increasing cooling, higher performance components may be packed inside the case and packed in more densely. This allows more performance to be provided in the same size case. The increased cooling translates into more Gbps stored or transferred.

Figure 2:
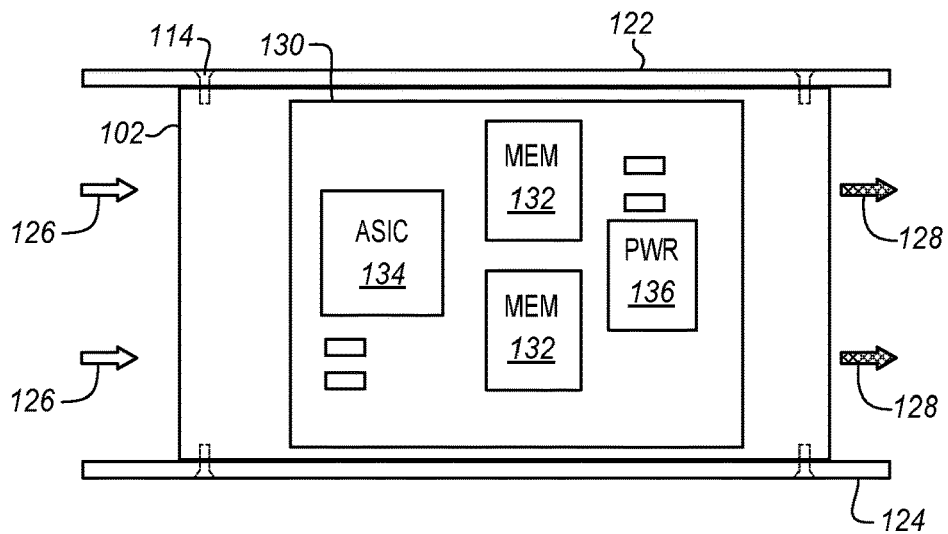
FIG. 2 is a top view diagram of a memory case with attached side rails according to an embodiment.

FIG. 2 is a top view diagram of the same SSF SSD mounted in a carrier. The top cover of the case is cut away to show the SSD PCB and the components mounted to the SSD. The SSF SSD case 102 is attached using a side rail 122, 124 on either side of the case attached by screws 114 to the threaded holes of the case. In some embodiments the side rails are also attached to top and bottom side covers of the carrier (not shown) that enclose the SSD case and guide air across the surface of the SSF SSD case. In some embodiments the side rails 122, 124 hold the SSD case to a system chassis which provides top and bottom faces. In either approach, the side rails, along with the top and bottom faces of the tray or system chassis (shown in FIG. 3), guide cool air 126 entering on one side (the left side as shown) across the surface of the case 102. The air exits as warm air 128 out the other side (the right side as shown).

For mounting in a memory bay of a system chassis, the top and bottom faces of the chassis bay in which the SSD is mounted are typically constructed of thin sheet metal. The side rails are mounted to mating walls of the chassis bay and are also typically constructed of sheet metal. There may be locks, tabs, screws, or other fasteners to hold the side rails in place in the system chassis bay. Sheet metal is used to keep costs low and also to reduce the weight of the overall system because many SSD enclosures can be installed in larger systems. Thick metal rails and thick metal chassis would add significantly to the weight of the total computing system. The heat transfer from the SSD enclosure (or case) to the sheet metal side rails is typically low due to the thin-ness of the material and limited contact area between the side rails and the SSD enclosure (or case). In such instances it may be important to improve the heat transfer from the SSD case (or enclosure) to the surrounding air. The airflow may be the major source of heat removal.

In addition to the air flow, the internal components of the SSF SSD are visible in this cross-sectional diagram. There is a system board or printed circuit board 130 that carries one or more memory chips 132. The memory chips are controlled and accessed through an ASIC 134 that is coupled to an external data connector (not shown). A power regulator 136 receives power from the external connector and feeds power to all of the components. There may also be other components coupled to the PCB not described fully herein.

At present, flash memory chips are in common use with memory cells in the form of NAND and MLC (Multi-Level Cell) circuits, however, the cases described herein may be used with other types of solid state memory including phase change memory, memristor memory, magnetic RAM, and any other types of memory for which cooling may be of interest.

When data throughput is high, the ASIC and the power regulator may become hot because they are under constant use. The memory chips may or may not experience increased heat load depending on whether the memory is being utilized as "hot" or "warm" storage or archival memory. The ASIC and power regulator are typically thermally coupled to the exterior, outer, or external cover and the memory may or may not be coupled also depending on the type of memory storage. Some or all of these components are thermally coupled to the external cover of the case and cooled by the cool air 126 entering between the system attach rails and the chassis bay top and bottom.

Figure 3:
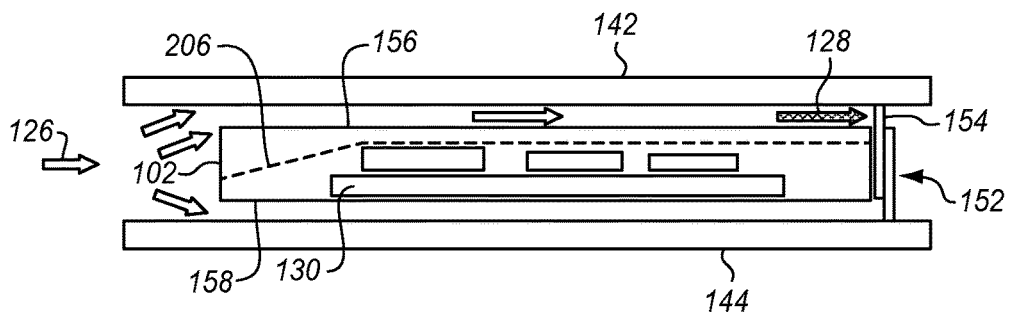
FIG. 3 is a cross-sectional side view diagram of a memory case mounted in a chassis to show airflow according to an embodiment.

FIG. 3 is a cross-sectional side view of the case of FIG. 2 showing baffles and an airflow ramp. There is also a top wall 142 over the SSF SSD 102 and a bottom wall 144 below the SSF SSD. In some embodiments, the top and bottom walls are attached to the system attachment rails 122, 124 shown in FIG. 2 and in FIG. 5 to create an enclosure that protects and secures the SSD, and channels air around the SSD case 102. In other embodiments, the top and bottom walls are part of another structure such as a server chassis or other mounting fixture. In both cases, the enclosure is open on the left to allow cool air 126 in and at the right to allow warm air 128 out after it has been heated by the SSD.

As shown there is an upper space 156 above the SSD case 102 and below the top wall for air flow. There is a similar lower space 158 for air flow below the case 102 and above the bottom wall 144. In this example, as shown in FIG. 2, there is no space for air flow along the sides of the case 102, however, in other embodiments, spaces may be allowed for such flow. The flow through the upper space and the lower space is regulated by a respective upper baffle 154 and lower baffle 152.

In some embodiments, the positions of these baffles may be adjusted and then fixed in position to allow more or less air flow, depending on the particular implementation. When the mounting configuration is known, then fixed baffles or plates may be used. As shown in this example implementation, the upper baffle is open allowing air flow through the upper space to cool the top of the SSD case 102. On the other hand the lower baffle is closed blocking any air flow. This stops air from flowing through the bottom and forces all of the movement over the top of the SSD case. In another embodiment, the top or bottom baffles or both may be located at the front of the chassis enclosure. In other words, they may be at the leading edge or entrance with respect to air flow instead of at the exit as shown.

Figure 4:
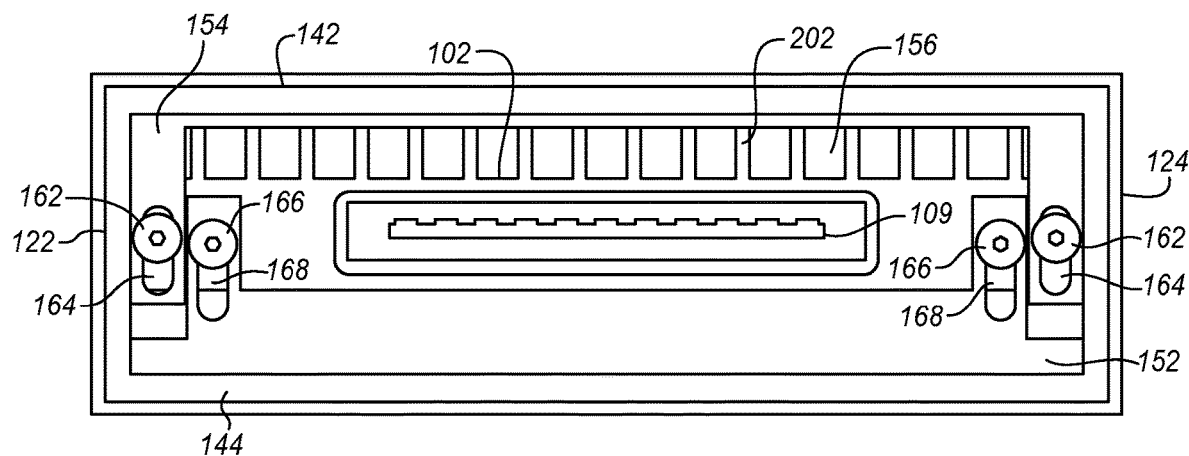
FIG. 4 is a rear plan view diagram of an enclosure with a memory case inside according to an embodiment.

FIG. 4 is a rear plan view of a carrier that includes the side walls 122, 124 and the top and bottom walls 142, 144. The SSD case 102 is carried inside. This SSD case shows a different type of power and data connector 109 from FIG. 1. Any of a variety of different types of connectors may be used to suit the particular implementation. The connector may be the same one as on the SSF SSD, or there may be an adapter or interface between the internal connector 110 of the SSD case and the external connector 109 of the carrier. Current connectors that may be used include SATA, PCIe (Peripheral Component Interconnect express), SAS (Serial Attached Small computer system interface), and Ethernet, among others. New connectors may be developed that are also suitable for this case and connector.

In this view, the upper baffle 154 is attached with a pair of screws 162 that extend through a vertical slot 164 in the baffle. The slot allows the baffle to be moved vertically to increase or decrease the opening to the upper air flow space 156. After positioning the upper baffle, the screws may be tightened to hold the baffle in place. As shown, the upper baffle is in a position to maximize air flow through the upper space 156. This position may be modified to suit different implementations.

The baffle may be adjusted, as shown, to ensure that all the air that flows over the top of the SSD case flows in between the cooling fins. Air flow above the tops (i.e., tips) of the cooling fins where the air will not physically come in contact with any part of the cooling fins may be reduced by a physical barrier across the back of the carrier above the cooling fins. In this example, the part of the upper space 156 that is above the fins is blocked. This position at the far end or trailing end with respect to air flow of the SSD case forces the air to flow through the most advantageous region of the cooling fins. Otherwise, the air might flow through the region of lower air resistance above the fins. Air that does not flow in between the cooling fins will not be able to remove as much heat from the SSD case. On the other hand, lower airflow resistance may be preferred in some systems.

Similarly, the lower baffle 152 has vertical slots 168 to allow the lower baffle to be moved up or down to adjust the air flow that is allowed through the lower space 158. Screws 166 through the slots tighten the lower baffle in place after an appropriate setting is made. The lower baffle is shown as completely covering the lower space 158 to block air flow through the lower space. This may be a suitable setting if the bottom of the SSD case 102 requires little or no cooling. In some implementations and chassis mounting position, higher air flow may be desired so that more air is able to reach components in the chassis after passing by the SSD case.

The baffles may be made of sheet metal, plastic, flexible rubber or any of a variety other materials and combinations. The baffles may include a seal to press against the top and bottom of a carrier or a chassis enclosure to account for irregularities of the carrier or chassis enclosure walls. Alternatively, the seals may on the chassis so that the baffles form a seal against the seals.

In this example, there are two screws for each baffle, one at each end of the SSD case 102. However more may be used to better secure the baffle. There may be slots or guides to ensure that the baffles remain aligned as they move vertically. Alternatively, the baffles may be fixed and incorporated separately or integrally into the case 102 or carrier. The baffles may alternatively be attached to the case or enclosure with an adhesive, rivet, weld, or other fastener. This figure also includes fins 202 in the upper space 156 described in more detail below.

Figure 5:
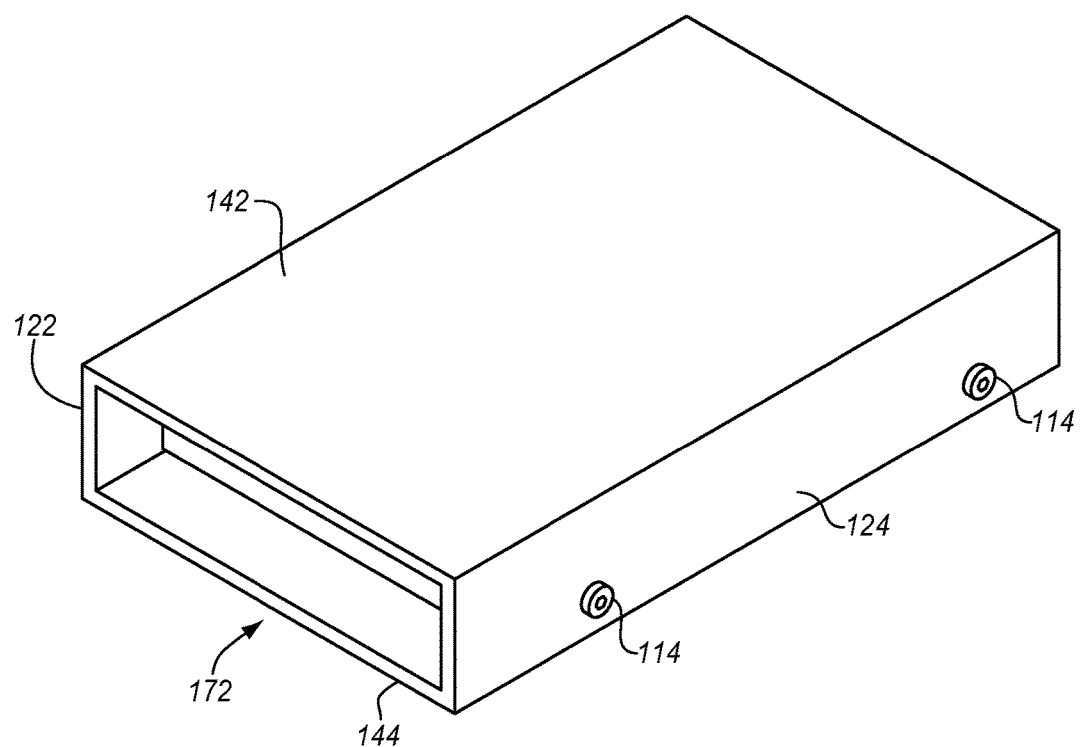
FIG. 5 is a front isometric view diagram of the enclosure with the memory case inside according to an embodiment.

FIG. 5 is an isometric view of the carrier described above that contains an SSF SSD case. This carrier is closed on four side and guides air flow. The carrier is suitable for mounting in other housings for server, workstation, memory array, or other uses. As described above, the carrier has a side rail 122, 124 on either side to which the SSD case is attached by screws 114 into the threaded holes on the sides of the SSD case. It is clear from this view that top or bottom screws may be used as alternatives. The carrier also has a top 142 and a bottom 144 and a front opening 172 that allows cooling air to enter.

Figure 6:
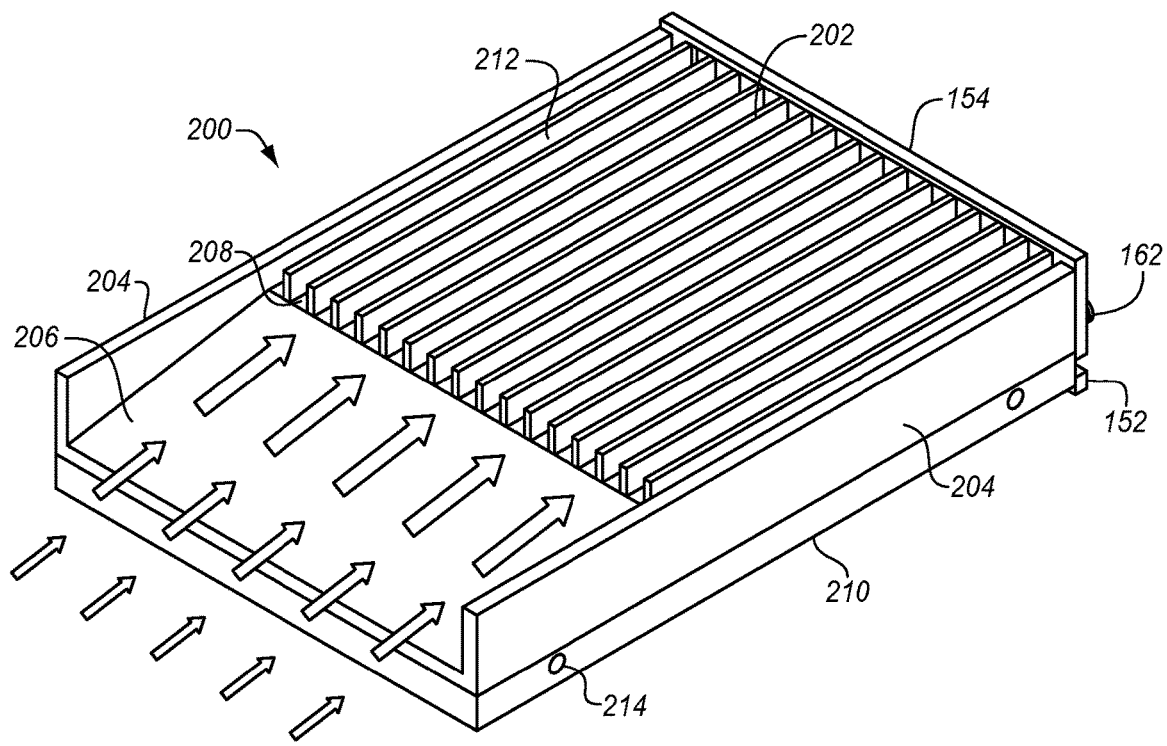
FIG. 6 is a front isometric view diagram of a memory case with enhanced cooling according to an embodiment.

FIG. 6 is an isometric front view of an alternative SSD case with improved airflow and cooling. This case may be fabricated in conformance to the 2.5" SSF standards and used instead of the case 102 shown in FIG. 1. Alternatively, the described features may be attached to a standard SFF case. This SSD case features cooling fins 202 and a front airflow ramp 206. The case is built on a base 210 which may be a separate part or integral with the rest of the case. In this example, the internal components are attached to the top cover 212 and then the base is attached over the bottom of the top cover to seal and protect the internal components.

The top cover 212 has side walls 204 on either side that are optionally at least as high as the fins 202 to channel air flow through the fins and to prevent air flow from moving to the side away from the fins. In some applications, side rails are attached to the case that prevent air flow to the side. The base 210 includes standard threaded attachment points 214. These are used in this case to attach to the side rails 122, 124 of the described carrier but may be used to attach the SSD case to any other system or chassis mounting arrangement. Bottom attachment points (not shown) may also be provided in the bottom surface of the base 210.

At the front of the case an airflow ramp 206 guides incoming cool air up toward a row of cooling fins 202. From the perspective of air flow, the front of the case at the ramp is the leading edge and the back of the case by the connector and at the back of the fins is the trailing edge. The air flows through channels 208 between the fins and then passes across the back. The fins extend parallel from the top of the cover and along the length of the cover from front to back.

The length of the ramp may be configured to fit the length of the enclosed PCB. The ramp as shown has an angle of about ten degrees and traverses about the front one third of the top cover. The rear two thirds carry the fins and there is no gap between the ramp and the fins so that the trailing edge of the ramp is adjacent to the leading edge of the fins. These proportions and sizes may be adjusted for thicker and thinner PCBs and for thicker and thinner form factors. The ramp extends at an angle away from the leading edge or front of the base so that the ramp is closer to the base at the front of the case and farther from the base adjacent the channels that are between the fins.

The leading edge of the ramp has a flat vertical surface extending from the base 210 of the case. As shown, with the base, this vertical surface extends about a third of the height of the case, e.g. 2-5 mm, depending on the case form factor. This vertical surface may be angled or minimized to further enhance air flow. The angle and length of the ramp may also be modified based on aerodynamic considerations to obtain a desired air flow with a particular expected air pressure and velocity.

The top and bottom parts of the chassis case may be cast from aluminum or another suitable heat conducting metal or constructed in whole or in part from copper for better heat transfer. The base 210 or bottom part can be stamped from sheet metal or molded from plastic or another suitable material. The top cover 210 may also be constructed of a cast aluminum with integral fins or with attached fins. As an example, folded fins may be attached to a flat or sloped top cover.

The SSD SFF form factor allows for different heights or thicknesses. Notebook computers tend to use an 8 or 9 mm height, however higher performance applications can use up to a 15 mm height. The height of the fins is limited by the form factor height and the space required for the internal components. Accordingly, the 15 mm SSD SFF case form factor height will enable the most alternatives for significant fin height with heights of up to 8 or 9 mm being possible. A thinner case form factor may have shorter fins.

The upper baffle 154 and its adjustment screws 162 are attached directly to this case, although they may instead be attached to the carrier or some other structure as mentioned above. The lower baffle 152 may also be attached to the SSD case 200. The power and data connector are at the rear of the case and are not visible in this view. If the SSD case is made to conform to the external dimensions of a 2.5" SFF case, then there is less internal room for components but there are significant cooling benefits. The case is thinner to make room for the fins and the very front of the case may not be thick enough to house a PCB with any components.

This new wedge shaped SSD case 200 with heat transfer fins 202 is able to capitalize on the use of ⅓ to ½-sized SSD PCBs. These will easily fit into the smaller interior space of the case. On the far end of the SSD case there are adjustable baffles that can be set to reduce or even eliminate the air bypass around the sides of the case and force it through the fins. The ramp 206 increases air flow past the fins with a venturi effect. The direction of air flow is shown by the arrows coming from the left and moving up the ramp to the channels between the fins. The top wall 142 of the carrier or chassis bay confines the air to the channels between the fins. The enhanced flow rate improves heat transfer from the case to the air. This improves cooling for the internal PCB and for the components mounted on the PCB.

Figure 7:
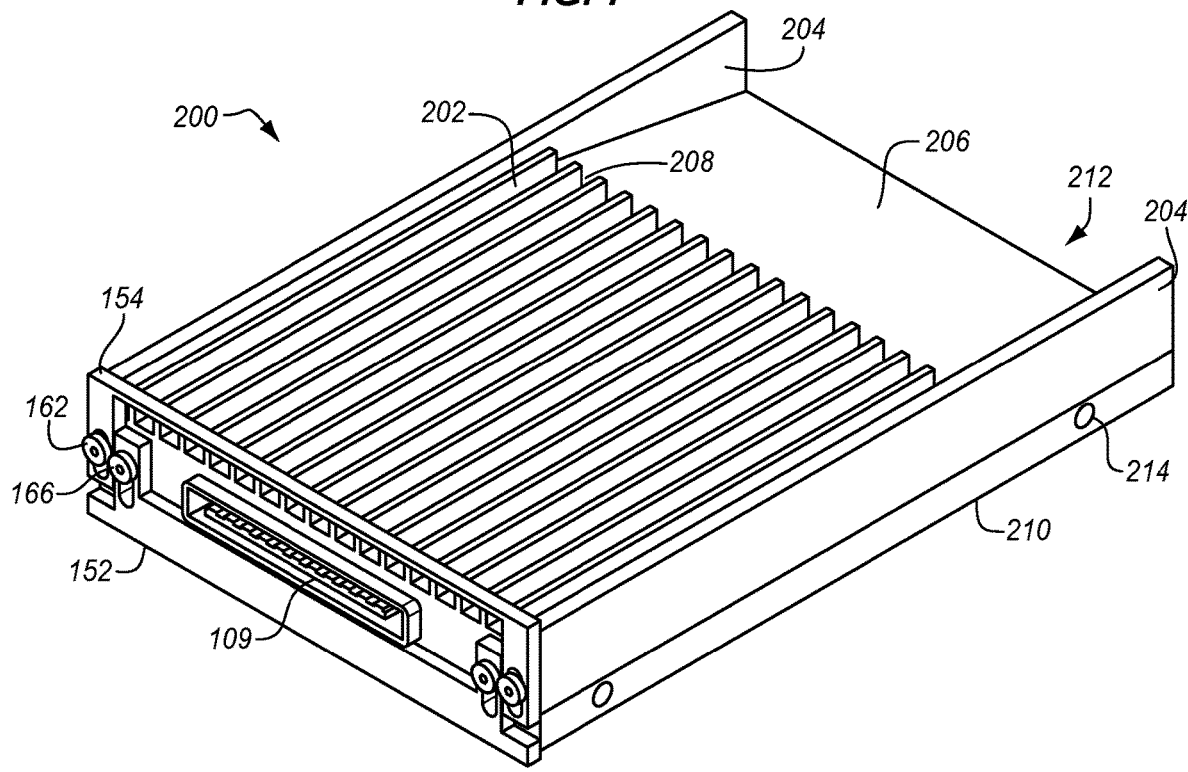
FIG. 7 is a rear isometric view diagram of a memory case with enhanced cooling according to an embodiment.

FIG. 7 is a rear isometric view of the same SSD case with enhanced cooling. The upper 154 and lower baffle 152 are attached directly to the case with screws 162, 166. The rear connector 109 may take any suitable form to provide power, data, and any other desired interface to the PCB inside the case.

Figure 8:
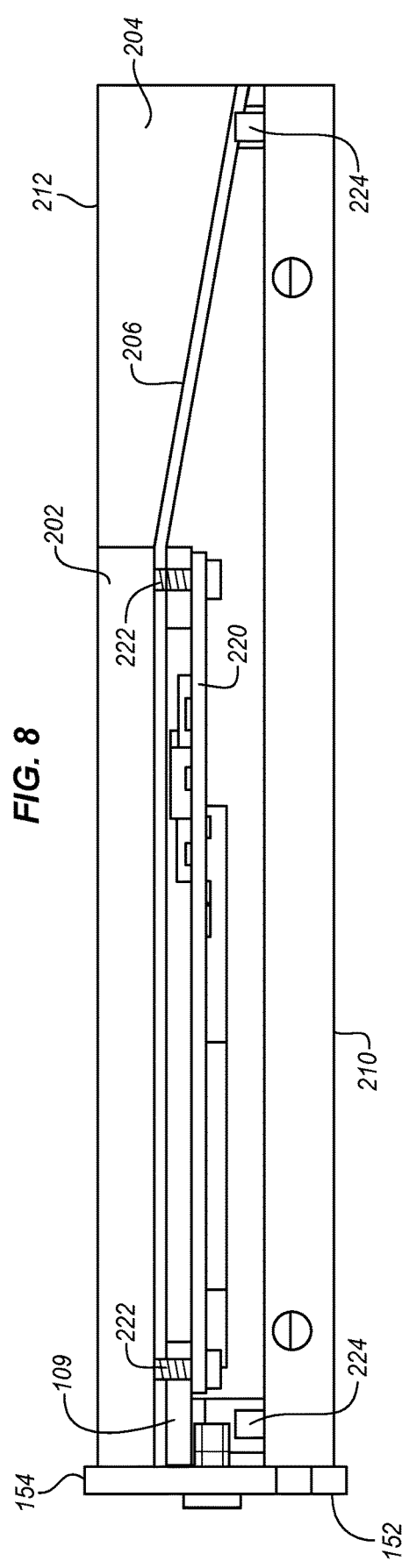
FIG. 8 is a side cross-sectional view diagram of a memory case with enhanced cooling according to an embodiment.

FIG. 8 is a cross-sectional side view of the case of FIGS. 6 and 7 to show how components are mounted to the case. The cover 212 that includes the fins 202 has an inner opening between the side walls 204 and the ramp 206. This opening provides room to attach a PCB 220 for the active memory system. The PCB is shown as a double sided PCB with a variety of different connected components. There may also be a rear connector 109 attached to the PCB for power and data. The PCB 220 is attached to the cover 212 with screws 222 of which only two are shown in this view. After the PCB is fixed in place, the base 210 is attached to the cover with further screws 224. The upper 154 and lower 152 baffles may optionally be added to the rear of the case with screws as described above.

The configuration and attachment points with various screws is provided as an example. By screwing the PCB to the cover, a thermal connection to the cover may be ensured. This improves the cooling of the PCB by taking advantage of the cooling effectiveness of the fins. However, the PCB may be attached to the cover in other ways or thermal coupling may be provided in another way without direct physical contact (such as via thermal radiation). The base may be attached with adhesives or in other ways. There may also be seals between the base and the cover and around the external connector 109 to protect the PCB and the components mounted to it. Alternatively, the PCB may be mounted to the base or to another structure not shown in this example.

Figure 9:
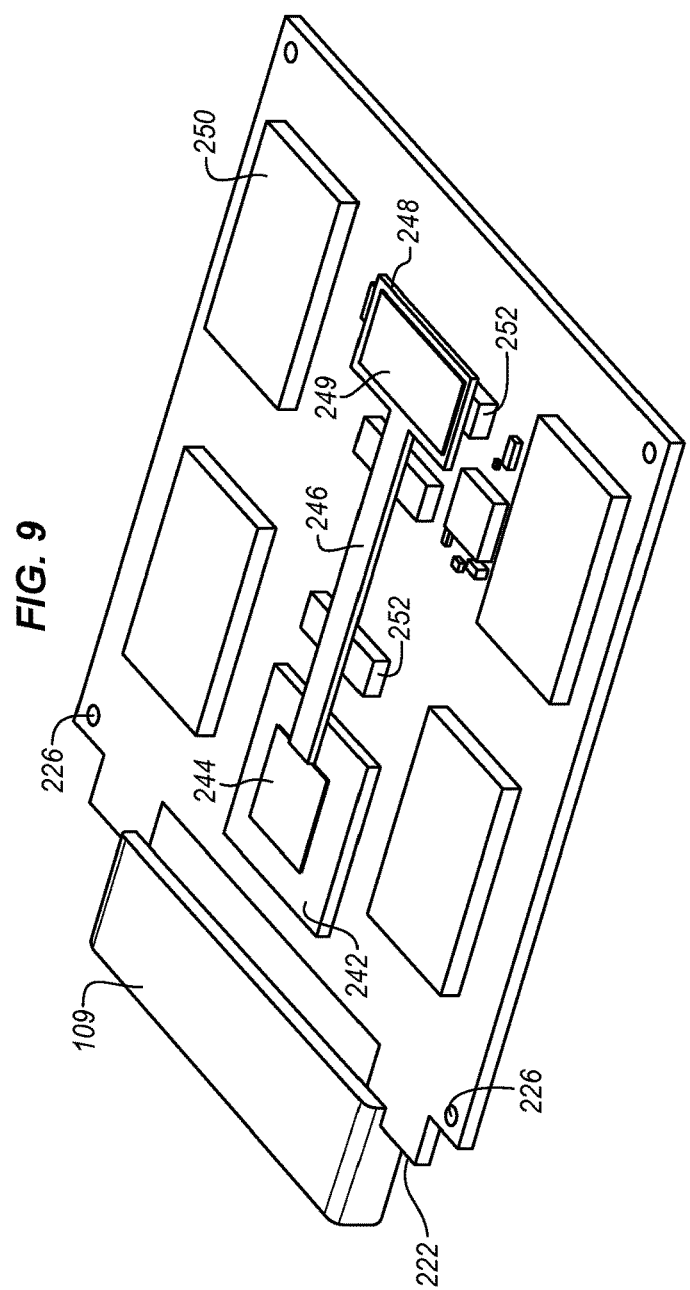
FIG. 9 is an isometric view of a memory circuit board with enhanced cooling according to an embodiment.

FIG. 9 is an example of a PCB 222 that may be attached to the cover 212 of the SSD case 200 with enhanced cooling. The PCB has four holes 226 for mounting the PCB to the top cover as described above. More or fewer mounting holes may be used and other fasteners may be used instead of screws. The PCB may instead be mounted to the base or some other bracket or support structure. The PCB in this example carries four memory chips 250, an ASIC 242 for memory access, routing, control, and maintenance and a variety of other components. In some embodiments, this is called a memory controller. A voltage regulator may be incorporated into the ASIC or provided as another component. There may be discrete capacitors, inductors and other components on the board. The particular arrangement, number, and types of components may be adapted to suit different applications.

In many SSD PCBs, the ASIC is located near the rear data and power connector 109. This reduces the length of the data transmission lines. On the other hand, it places the ASIC near the rear of the case 200. Under high I/O traffic scenarios, the ASIC becomes hot and the power and speed budget for the ASIC may be limited by its ability to eliminate excess heat. At the same time, the cooling air at the rear of the case is already much warmer than at the front of the case having passed through the fins.

In this example, there is a heat pipe 246 coupled to a heat transfer pad 244 on the top of the ASIC. The heat transfer pad conducts heat from the top of the ASIC. The heat transfer pad is connected to a heat pipe 246 that conducts the heat to another heat transfer pad 248 at the other end of the PCB. The heat transfer pad may be placed over another electronic component or over a standoff 252. The heat pipe travels over a set of isolated or insulating standoffs 252 to the front of the PCB. The second heat transfer pad 248 is covered in a thermal interface material 249 to provide thermal conduction to a corresponding pad or surface of the top cover 212 of the case 200. This allows the cooling of the ASIC to be improved by dumping the heat from the ASIC into the region of the cooling fins at the front or leading edge of the case that has cooler air.

Figure 10:
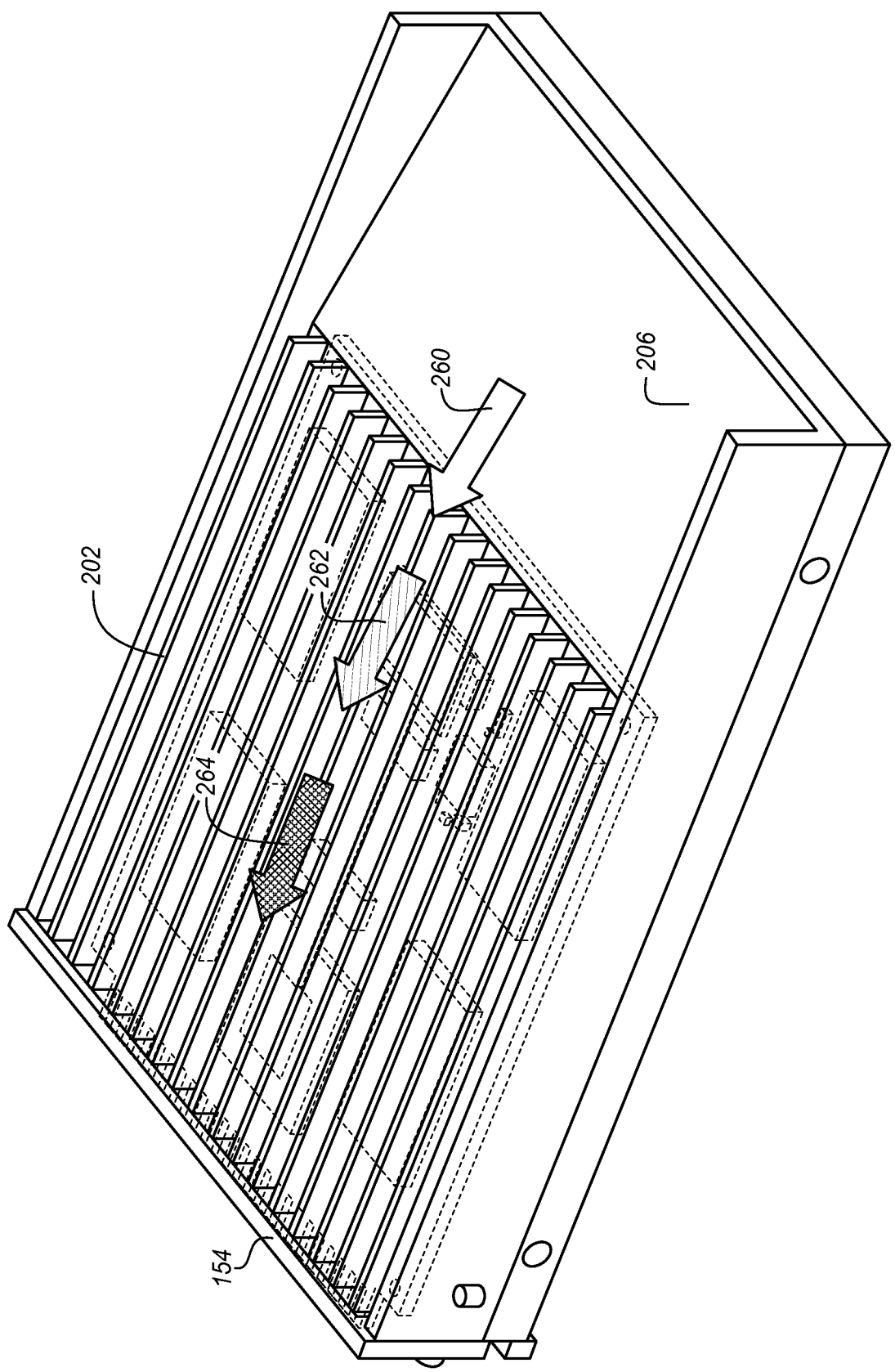
FIG. 10 is a partially transparent isometric view of a memory case with enhanced cooling showing the memory circuit board according to an embodiment.

FIG. 10 shows the same PCB mounted inside a case 200. The arrows show cool air 260 arriving at the ramp 206 and being pushed up to the front of the fins near where the second transfer pad 248 conducts heat to the fins. The air is then warmed 262 and becomes hotter air 264 as it reaches the position of the ASIC 242 within the case. The hotter air then exits between the fins 202 and through the baffle 154 at the rear of the case.

As described, this case enables higher power SSD's to be used in a given air flow environment and hence allows higher performance (Gbps) per server volume, which allows for more performance in the same space. The case has adjustable baffles to prevent or allow air bypass in varying amounts to either increase air velocity past the heat transfer fins or to reduce the air velocity to lower the airflow impedance and the load on the system fans.

The slanted region on the leading edge of the case can also lower the airflow impedance and reduce the load on the system fans or allow for lower capability fans if there are many drives in a single server rack. By contrast a conventional drive with a flat face causes the air to pile up and slow down before moving to go around the flat face. The air therefore suffers a significant pressure loss as it tries to flow around the front of the case.

A heat pipe may be used inside the case to transfer the heat from the hottest PCB components to the most efficient fin region to improve heat transfer. The case together with its enclosure both enhances the heat transfer using fins and directs some or all the air flow through the fins instead of around the other faces of the SSD case where heat transfer will be minimal compared to air getting directed through the fins.

This case allows a given amount of memory to function at a higher speed because useful memory speed is related to the temperature of the memory and the controller. Increased memory speed relates to higher system computational speed whether it be for mathematical simulation, graphics or for streaming video. Increased thermal capacity can also enable a larger amount of memory to be physically placed and cooled in a given volume of a container or case made to hold the memory. An increased quantity of memory can also translate into increased system performance.

The case is shown as being particularly suitable for a rectangular system chassis mounting bay or a carrier as shown in FIG. 5, but the air flow and fin characteristics of the case 200 may improve performance of the memory in many other applications. Many other computer cases and memory arrays have some system to draw air across the outer case of an SSD. The unique features and configuration of this SSD case are particularly well-suited to many different airflow environments. In addition, while the examples are presented in the context of a 2.5" SSF case, the same approach may be applied to other similar rectangular housings where cooling is important. As an example, the 1.8" and the 3.5" SFF hard disk standards have already been applied to SSDs. Other form factor standards may be developed or extended in the future.

Figure 11:
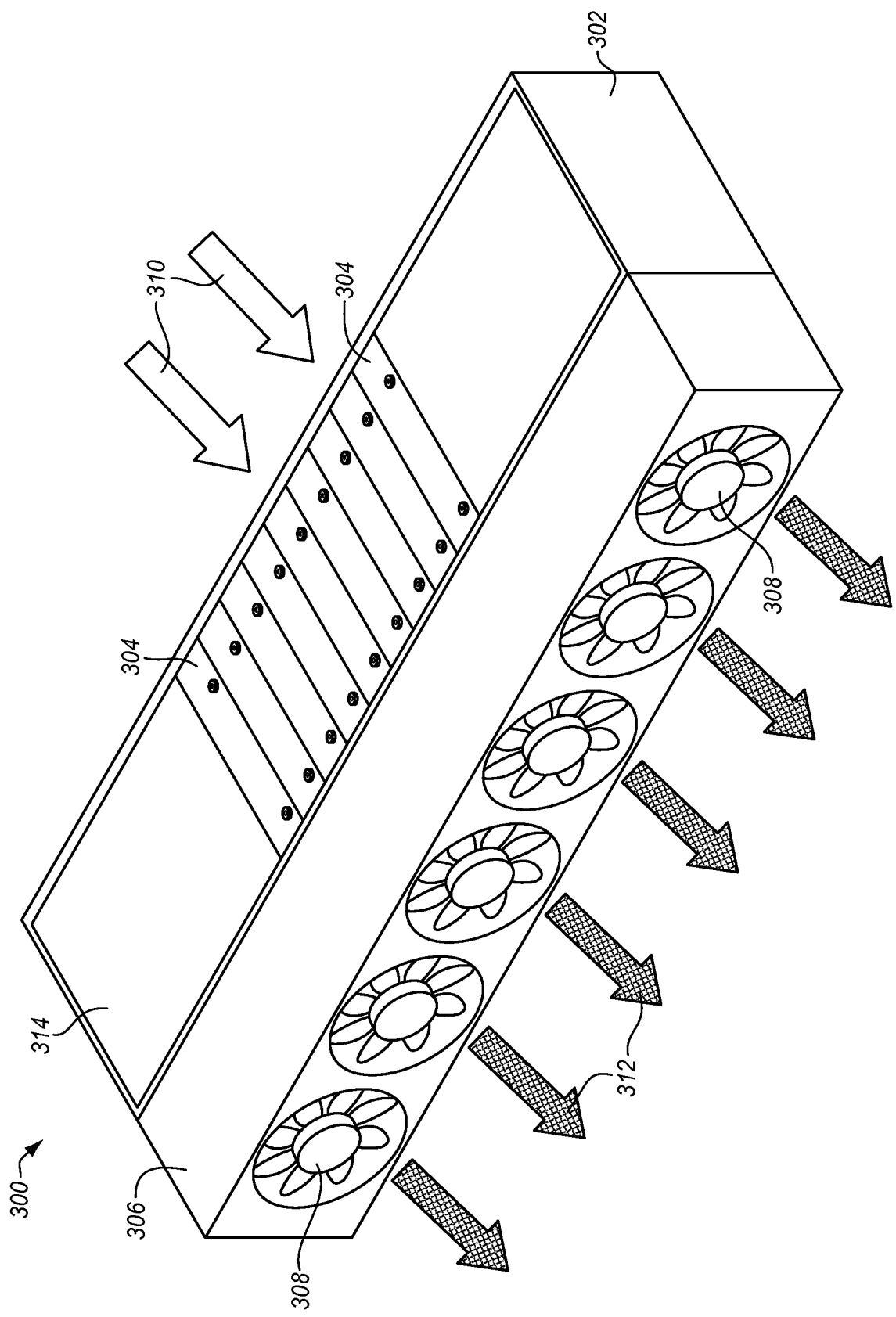
FIG. 11 is a rear isometric view of a rack mount chassis to carry memory cases according to an embodiment.

FIG. 11 is an isometric rear view of a portion of a server rack chassis 300 for carrying a set of SSF SSD's. The chassis 300 has a main housing 302 with a tray or platform to carry a set of SSF SSD's 304. These SSDs may be in SSF cases or the cases may be mounted to side rail carriers or fully enclosed carriers as described above. The chassis also carries a fan plenum 306 that carries a row of fans 308. The fans pull air 310 across the SSD's and out 312 through the other side. The heated air is exhausted out the rear of the chassis.

Figure 12:
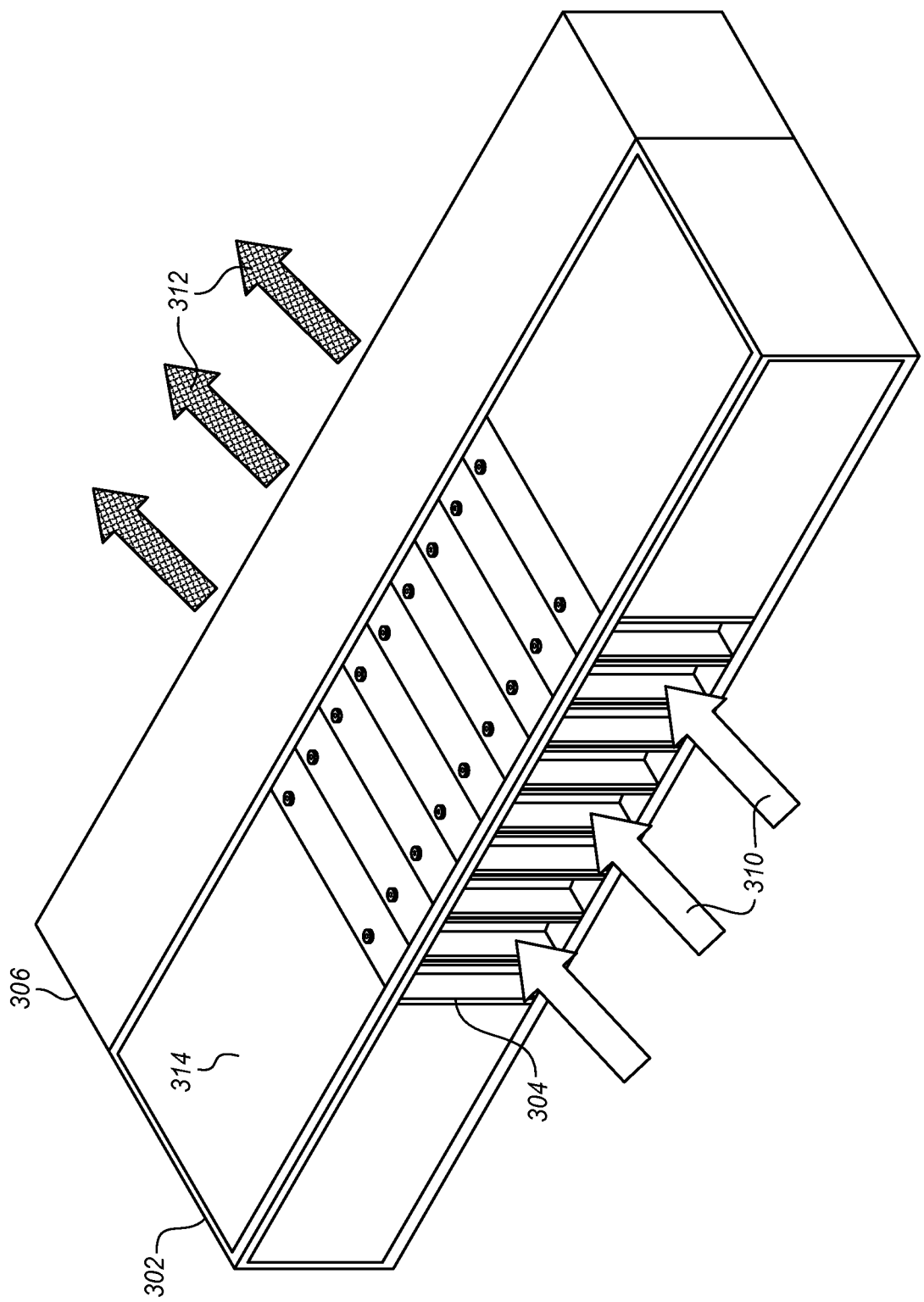
FIG. 12 is a front isometric view of a rack mount chassis to carry memory cases according to an embodiment.

FIG. 12 is an isometric front view that shows the same chassis from the other side. Each SSD case is inside a chassis mounting bay that has an opening for air 310 to enter and cool the corresponding SSD 304. There are plugged off areas 314 for any unused space in the chassis. The fan plenum may be adapted to suit the number of SSDs being used. The external connectors may be connected within the fan plenum to any external components. This portion of the chassis that carries the memory may be combined with other additional rows of memory and fans or with other components such as communication interfaces, computing resources, switching resources or other elements to serve any desired purposes of the rack mount system.

Figure 13:
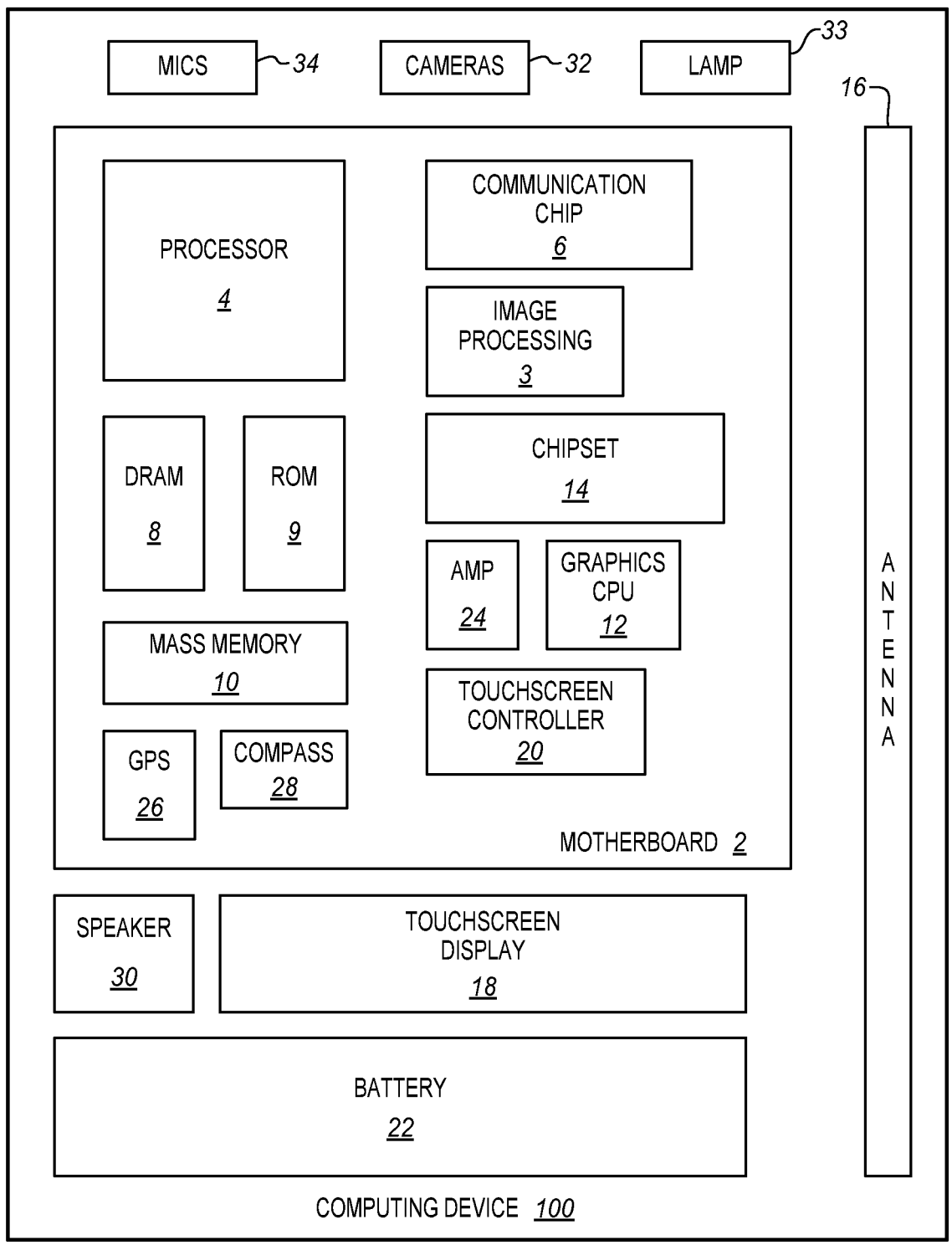
FIG. 13 is a block diagram of a computing device incorporating memory cases with enhanced cooling according to an embodiment.

FIG. 13 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, a lamp 33, a microphone array 34, and a mass storage device (such as a hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The mass memory 10 may contain one or more solid state memory devices in cases with enhanced cooling. The memory devices may be attached to side rails or carriers and then mounted in the same or another chassis with the processor and other components. In some implementations, the memory devices may be coupled only to a communications interface to connect with external processing resources.

In various implementations, the computing device 100 may be a laptop, a netbook, a notebook, an ultrabook, a smartphone, a tablet, a personal digital assistant (PDA), an ultra mobile PC, a mobile phone, a desktop computer, a workstation, a server, a set-top box, an entertainment control unit. The computing device may be fixed, portable, or wearable. In further implementations, the computing device 100 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a case that includes a base, a cover having a plurality of fins on a top of the cover, channels between the fins, defined by the fins, and a ramp extending from a front on the top of the cover to the channels, and an inner cavity defined by the base and the cover to house a solid state memory.

In further embodiments the ramp extends at an angle away from the base so that the ramp is closer to the base at the front of the case and farther from the base adjacent the channels.

Some embodiments include an opening in the cover opposite the ramp for a connector to the solid state memory.

Some embodiments include side walls on each side of the ramp to maintain air flow along the ramp to the channels.

In further embodiments the side walls are configured to meet dimensional standards of a small form factor drive.

In further embodiments the fins extend parallel from the top of the cover and along the length of the cover from front to back.

In further embodiments the ramp extends about one third of the distance from the front to the rear of the top cover at an angle of about 10 degrees.

Some embodiments include a baffle attached to the rear of the top cover and adjustable vertically to restrict air flow through the channels.

In further embodiments the baffle comprises a plate with passages for air flow.

Some embodiments include a baffle to restrict air flow under the base.

Some embodiments include a system board to carry the solid state memory, the system board attaching to the cover within the inner cavity.

In further embodiments the system board is further to carry a chip at a first location, the system board further comprising a heat pipe from the chip at the first location to a heat transfer pad at a second location, the heat transfer pad being configured to conduct heat from the chip at the first location to the cover at the second location.

Some embodiments include threaded attachment points in the base adapted to fit a carrier.

Some embodiments pertain to solid state memory carrier that includes a first and a second system attach rail configured to connect to opposing sides of a solid state memory case, a top cover extending from the first system attach rail to the second system attach rail, a bottom cover extending from the first system attach rail to the second, the carrier having a first opening at a first end of the system attach rails to receive air into the enclosure and a second opening at a second opposite end of the system attach rails to allow the received air to exit the enclosure, an upper baffle to restrict (or modulate) air flow into the carrier and above the solid state memory, and a lower baffle to restrict (or modulate) air flow into the carrier and below the solid state memory.

In further embodiments the upper baffle is adjustable to allow more or less air flow above the solid state memory.

Some embodiments include attachment points to carry the solid state memory and to mount the enclosure into a chassis, the chassis having fans to draw air into the first opening.

Some embodiments include a case enclosing the solid state memory, the case being attached to the first and the second system attach rails, and wherein the upper baffle and the lower baffle are attached to the case.

Some embodiments pertain to a memory chassis configured to mount in a server rack, the chassis including a main housing defining a plurality of bays each to carry a memory in a case, and a fan plenum to draw air across the memory cases, wherein the memory cases each comprise a base, a cover, the cover having a plurality of fins on a top of the cover, channels between the fins, defined by the fins, and a ramp extending from a front on the top of the cover to the channels, and an inner cavity defined by the base and the cover to house a solid state memory.

In further embodiments each bay includes a top wall to confine air flow to a space above the respective case and across the fins and a bottom wall to confine air flow to a space below the respective case.

In further embodiments each memory case further comprises a baffle attached to the rear of the top cover and adjustable vertically to restrict air flow through the space above the respective case.

The invention claimed is:

1. A case to enclose a solid state memory, the case comprising:
   a base;
   a cover, the cover having a plurality of fins on a top of the cover, channels between the fins, defined by the fins, and a ramp extending from a front on the top of the cover to the channels; and an inner cavity defined by the base and the cover to house the solid state memory.

2. The case of claim 1, wherein the ramp extends at an angle away from the base so that the ramp is closer to the base at the front of the case and farther from the base adjacent the channels.

3. The case of claim 1, further comprising an opening in the cover opposite the ramp for a connector to the solid state memory.

4. The case of claim 1, further comprising side walls on each side of the ramp to maintain air flow along the ramp to the channels.

5. The case of claim 4, wherein the side walls are configured to meet dimensional standards of a small form factor drive.

6. The case of claim 1, wherein the fins extend parallel from the top of the cover and along the length of the cover from front to back.

7. The case of claim 1, wherein the ramp extends about one third of the distance from the front to the rear of the top cover at an angle of about 10 degrees.

8. The case of claim 1, further comprising a baffle attached to the rear of the top cover and adjustable vertically to restrict air flow through the channels.

9. The case of claim 8, wherein the baffle comprises a plate with passages for air flow.

10. The case of claim 1, further comprising a baffle to restrict air flow under the base.

11. The case of claim 1, further comprising a system board to carry the solid state memory, the system board attaching to the cover within the inner cavity.

12. The case of claim 11, wherein the system board is further to carry a chip at a first location, the system board further comprising a heat pipe from the chip at the first location to a heat transfer pad at a second location, the heat transfer pad being configured to conduct heat from the chip at the first location to the cover at the second location.

13. The case of claim 1, further comprising threaded attachment points in the base adapted to fit a carrier.

14. A solid state memory carrier comprising:
a first and a second system attach rail configured to connect to opposing sides of a solid state memory case, the solid state memory case including a solid state memory;
a top cover extending from the first system attach rail to the second system attach rail;
a bottom cover extending from the first system attach rail to the second system attach rail;
the carrier having a first opening at a first end of the system attach rails to receive air into the carrier and a second opening at a second opposite end of the system attach rails to allow the received air to exit the carrier;
an upper baffle to restrict air flow into the carrier and above the solid state memory, the upper baffle between the solid state memory and the second opening; and
a lower baffle to restrict air flow into the carrier and below the solid state memory, the lower baffle between the solid state memory and the second opening.

15. The enclosure of claim 14, wherein the upper baffle is adjustable to allow more or less air flow above the solid state memory.

16. The enclosure of claim 14, further comprising attachment points to carry the solid state memory and to mount the carrier into a chassis, the chassis having fans to draw air into the first opening.

17. The enclosure of claim 14, further comprising a case enclosing the solid state memory, the case being attached to the first and the second system attach rails.

18. A memory chassis configured to mount in a server rack, the chassis comprising:
a main housing defining a plurality of bays each to carry a memory in a case; and
a fan plenum to draw air across the memory cases, wherein the memory cases each comprise a base, a cover, the cover having a plurality of fins on a top of the cover, channels between the fins, defined by the fins, and a ramp extending from a front on the top of the cover to the channels, and an inner cavity defined by the base and the cover to house a solid state memory.

19. The memory chassis of claim 18, wherein each case includes a top wall to confine air flow to a space above the respective case and across the fins and a bottom wall to confine air flow to a space below the respective case.

20. The memory chassis of claim 19, wherein each memory case further comprises a baffle attached to the rear of the cover and adjustable vertically to restrict air flow through the space above the respective case.

\* \* \* \* \*